(12) United States Patent
Du et al.

(10) Patent No.: US 11,008,484 B1
(45) Date of Patent: May 18, 2021

(54) OPTICAL ADHESIVE, METHOD FOR MANUFACTURING OPTICAL ADHESIVE, AND DISPLAY DEVICE

(71) Applicant: BOE TECHNOLOGY GROUP CO., LTD., Beijing (CN)

(72) Inventors: Shuang Du, Beijing (CN); Pao Ming Tsai, Beijing (CN); Jiahao Zhang, Beijing (CN); Yunjin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/640,113

(22) PCT Filed: Aug. 7, 2019

(86) PCT No.: PCT/CN2019/099661
§ 371 (c)(1),
(2) Date: Feb. 19, 2020

(87) PCT Pub. No.: WO2020/042885
PCT Pub. Date: Mar. 5, 2020

(30) Foreign Application Priority Data

Aug. 29, 2018 (CN) .......................... 201810992205.0

(51) Int. Cl.
*C09J 7/38* (2018.01)
*C09J 11/08* (2006.01)
(Continued)

(52) U.S. Cl.
CPC . *C09J 7/38* (2018.01); *C09J 7/10* (2018.01); *C09J 11/08* (2013.01); *G06F 3/041* (2013.01);
(Continued)

(58) Field of Classification Search
None
See application file for complete search history.

(56) References Cited

U.S. PATENT DOCUMENTS

2013/0164478 A1 6/2013 Yamamoto et al.
2014/0044908 A1 2/2014 Inenaga
(Continued)

FOREIGN PATENT DOCUMENTS

CN 102186939 A 9/2011
CN 102510888 A 6/2012
(Continued)

OTHER PUBLICATIONS

Zhou et al., "Experimental Course on Characterization and Analysis of Polymer Material Structure",Elite Project Textbook of Sichuan University, Mar. 2015, Sichuan University Press.
(Continued)

*Primary Examiner* — J. E. Schoenholtz
(74) *Attorney, Agent, or Firm* — Dilworth & Barrese, LLP.; Michael J. Musella, Esq.

(57) ABSTRACT

An optical adhesive, a method for manufacturing an optical adhesive, and a display device are provided. The optical adhesive includes a first, adhesive Layer, a second adhesive layer, and a third adhesive layer that are sequentially stacked, a storage modulus of the first adhesive layer is greater than a storage modulus of the third adhesive layer; and the storage modulus of the first adhesive layer and the storage modulus pf the third adhesive layer are both greater than a storage modulus of the second adhesive layer.

20 Claims, 4 Drawing Sheets

(51) Int. Cl.
  *C09J 7/10* (2018.01)
  *G06F 3/041* (2006.01)
  *H01L 27/32* (2006.01)
  *H01L 51/52* (2006.01)
  *H01L 51/56* (2006.01)
  *H01L 51/00* (2006.01)

(52) U.S. Cl.
  CPC ........ *H01L 27/323* (2013.01); *H01L 51/0097* (2013.01); *H01L 51/524* (2013.01); *H01L 51/5281* (2013.01); *H01L 51/56* (2013.01); *C09J 2301/208* (2020.08); *C09J 2301/414* (2020.08); *H01L 2251/5338* (2013.01)

(56) References Cited

U.S. PATENT DOCUMENTS

| | | |
|---|---|---|
| 2015/0200375 A1 | 7/2015 | Kim et al. |
| 2017/0309867 A1 | 10/2017 | Mun et al. |
| 2018/0050473 A1 | 2/2018 | Radcliffe et al. |
| 2020/0058899 A1 | 2/2020 | Bu et al. |
| 2020/0239738 A1* | 7/2020 | Naito ................ B32B 7/12 |

FOREIGN PATENT DOCUMENTS

| | | |
|---|---|---|
| CN | 102863912 A | 1/2013 |
| CN | 104779266 A | 7/2015 |
| CN | 105005108 A | 10/2015 |
| CN | 106530973 A | 3/2017 |
| CN | 107305756 A | 10/2017 |
| CN | 108034373 A | 5/2018 |
| CN | 109135593 A | 1/2019 |
| EP | 2792724 A1 | 10/2014 |
| JP | 2011219665 A | 11/2011 |
| KR | 20160076746 A | 7/2016 |
| KR | 20180084525 A | 7/2018 |

OTHER PUBLICATIONS

Wen et al., "Pharmaceutical Polymer Materials", National JCM Industry Higher Education, 13th Five Year Plan Textbook, Jun. 2017, Zhaoxian Culture and Education Color Printing Factory, Beijing.

Yan et al. "Characteristics of optical adhesives in touch panel" vol. 32, No. 4, Apr. 2017, Chinese Journal of Liquid Crystal and Displays.

Rajab et al. "Production of Hybrid macro/micro/nano surface structures on Ti6A14V surfaces by picosecond laser surface texturing and their antifouling characteristics" Colloids and Surfaces B: Biointerfaces 160 (2017), Jun. 2, 2017, pp. 688-696.

First Chinese Office Action and in Priority Chinese Application No. 201810992205.0 dated Feb. 6, 2020.

* cited by examiner

OPTICAL ADHESIVE, METHOD FOR MANUFACTURING OPTICAL ADHESIVE, AND DISPLAY DEVICE

The present application claims priority of Chinese Patent Application No. 201810992205.0, filed on Aug. 29, 2018, the disclosure of which is incorporated herein by reference in its entirety as part of the present application.

TECHNICAL FIELD

Embodiments of the present disclosure relate to an optical adhesive, a method for manufacturing an optical adhesive, and a display device.

BACKGROUND

With the development of display technology, display devices have gradually been applied to many fields and become one of the most widely used electronic devices. A display device usually includes a display panel, and may further include components such as a touch structure (e.g., a touch screen), a polarizer, a protective structure (e.g., a cover layer), and the like. The above-mentioned components are bonded together by, for example, an optical adhesive. The optical adhesive is a special adhesive for bonding transparent optical elements, and has the characteristics of colorless and transparent, high light transmittance, good bonding strength, and the like. The optical adhesive can bond various components in the display device, and the optical adhesive does not affect the normal display while achieving the bonding function, and is one of the important raw materials in the display device.

SUMMARY

At least one embodiment of the present disclosure provides an optical adhesive, and the optical adhesive comprises a first adhesive layer, a second adhesive layer, and a third adhesive layer that are sequentially stacked. A storage modulus of the first adhesive layer is greater than a storage modulus of the third adhesive layer, and the storage modulus of the first adhesive layer and the storage modulus of the third adhesive layer are both greater than a storage modulus of the second adhesive layer.

For example, in the optical adhesive provided by an embodiment of the present disclosure, the storage modulus of the first adhesive layer is 50 KPa-200 KPa.

For example, in the optical adhesive provided by an embodiment of the present disclosure, the storage modulus of the second adhesive layer is 15 KPa-80 KPa.

For example, in the optical adhesive provided by an embodiment of the present disclosure, the storage modulus of the third adhesive layer is 30 KPa-100 KPa.

For example, in the optical adhesive provided by an embodiment of the present disclosure, a glass transition temperature of the optical adhesive is lower than −30° C.

For example, in the optical adhesive provided by an embodiment of the present disclosure, a thickness of the first adhesive layer is 2 μm to 30 μm, a thickness of the second adhesive layer is 5 μm to 100 μm, and a thickness of the third adhesive layer is 2 μm to 100 μm.

For example, the optical adhesive provided by an embodiment of the present disclosure further comprises a first release film on a side of the first adhesive layer away from the second adhesive layer, and a second release film on a side of the third adhesive layer away from the second adhesive layer.

For example, in the optical adhesive provided by an embodiment of the present disclosure, a transmittance of the first adhesive layer, a transmittance of the second adhesive layer, and a transmittance of the third adhesive layer are all greater than 93%, and a haze of the first adhesive layer, a haze of the second adhesive layer, and a haze of the third adhesive layer are all less than 1%.

At least one embodiment of the present disclosure also provides a display device, and the display device comprises a display panel and a cover layer which are stacked, an adhesive film is provided between the display panel and the cover layer, the adhesive film comprises the optical adhesive according to any one of the embodiments of the present disclosure, and a side of the first adhesive layer of the optical adhesive away from the second adhesive layer is subjected to a compressive stress in a case where the display device is bent.

For example, in the display device provided by an embodiment of the present disclosure, in the case where the display device is bent, the cover layer is outside the display panel, the first adhesive layer is in contact with the cover layer, and the third adhesive layer is in contact with the display panel.

For example, in the display device provided by an embodiment of the present disclosure, the display panel is a flexible organic light emitting diode display panel.

For example, the display device provided by an embodiment of the present disclosure further comprises a polarizer, the polarizer is between the display panel and the cover layer, and the adhesive film is provided between the display panel and the polarizer as well as between the polarizer and the cover layer.

For example, the display device provided by an embodiment of the present disclosure further comprises a touch structure layer, the touch structure layer is sandwiched between the polarizer and the cover layer, and the adhesive film is provided between the polarizer and touch structure layer as well as between the touch structure layer and the cover layer.

For example, in the display device provided by an embodiment of the present disclosure, the display device is configured to be bent with a radius of curvature of 1 mm to 6 mm.

At least one embodiment of the present disclosure also provides a method for manufacturing an optical adhesive, and the method comprises: coating a first mixture on a first release film, and curing the first mixture to form a first adhesive layer; coating a second mixture on the first mixture, and curing the second mixture to form a second adhesive layer; and coating a third mixture on the second mixture, and curing the third mixture to form a third adhesive layer. A storage modulus of the first adhesive layer is greater than a storage modulus of the third adhesive layer, and the storage modulus of the first adhesive layer and the storage modulus of the third adhesive layer are both greater than a storage modulus of the second adhesive layer.

For example, in the method for manufacturing the optical adhesive provided by an embodiment of the present disclosure, the first adhesive layer, the second adhesive layer, and the third adhesive layer are formed in a same curing process, or are respectively formed in curing processes which are independent to each other.

For example, the method for manufacturing the optical adhesive provided by an embodiment of the present disclosure further comprises: providing a second release film, and covering the second release film on a side of the third adhesive layer away from the second adhesive layer.

For example, in the method for manufacturing the optical adhesive provided by an embodiment of the present disclosure, each of the first mixture, the second mixture, and the third mixture comprises a monomer mixture, an initiator, and a crosslinking agent.

For example, in the method for manufacturing the optical adhesive provided by an embodiment of the present disclosure, each of the first mixture, the second mixture, and the third mixture further comprises organic nanoparticles.

For example, in the method for manufacturing the optical adhesive provided by an embodiment of the present disclosure, a ratio of the initiator in the first mixture, a ratio of the initiator in the second mixture, and a ratio of the initiator in the third mixture are different, so as to allow the storage modulus of the first adhesive layer to be greater than the storage modulus of the third adhesive layer and allow both the storage modulus of the first adhesive layer and the storage modulus of the third adhesive layer to be greater than the storage modulus of the second adhesive layer.

For example, in the method for manufacturing the optical adhesive provided by an embodiment of the present disclosure, in curing processes of forming the first adhesive layer, the second adhesive layer, and the third adhesive layer, respectively, a reaction rate of the first mixture, a reaction rate of the second mixture, and a reaction rate of the third mixture are different, so as to allow the storage modulus of the first adhesive layer to be greater than the storage modulus of the third adhesive layer and allow both the storage modulus of the first adhesive layer and the storage modulus of the third adhesive layer to be greater than the storage modulus of the second adhesive layer.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
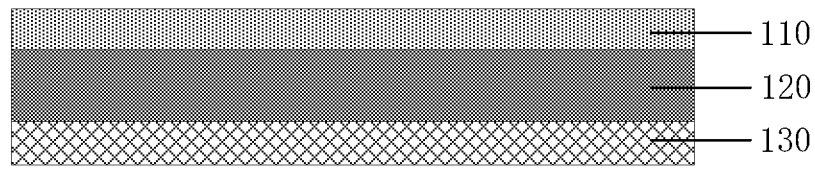
FIG. 1 is a schematic diagram of a layer structure of an optical adhesive provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Based on the demands for flexible display in fields such as smart phones, wearable smart devices, virtual reality, augmented reality, and other fields, flexible display technology has gradually become the next generation core display technology. A flexible display device can be bent or folded and is suitable for various application scenarios, which effectively improves the user experience.

The flexible display device generally includes a flexible display panel and a plurality of external components, and these components are bonded to each other through an optical adhesive. During a process of bending or folding the flexible display device, the strain of the flexible display panel and the external components is generated due to any one of a compressive stress and a tensile stress. Due to the effects of the stress, various components of the flexible display device may have problems of film failure such as wrinkling, fracturing, and separating. Therefore, in the flexible display device, a stress control component (that is, a neutral layer) needs to be provided, so that each component has a smaller amount of deformation during the bending and folding process. For example, the stress control component is usually an optical adhesive, while the conventional optical adhesive has insufficient stress control effect and is difficult to satisfy application requirements.

At least one embodiment of the present disclosure provides an optical adhesive, a method for manufacturing an optical adhesive, and a display device. The optical adhesive not only has strong adhesive ability, but also can reduce the bending stress of the components bonded to the optical adhesive, thereby suppressing the generation of air bubbles, and avoiding the problems of film failure such as wrinkling, fracturing and separating.

Hereinafter, the embodiments of the present disclosure are described in detail with reference to the accompanying drawings. It should be noted that the same reference numeral in different drawings is used to refer to the same element that has been described.

At least one embodiment of the present disclosure provides an optical adhesive, and the optical adhesive comprises a first adhesive layer, a second adhesive layer, and a third adhesive layer that are sequentially stacked. A storage modulus of the first adhesive layer is greater than a storage modulus of the third adhesive layer, and the storage modulus of the first adhesive layer and the storage modulus of the third adhesive layer are both greater than a storage modulus of the second adhesive layer.

FIG. 1 is a schematic diagram of a layer structure of an optical adhesive provided by at least one embodiment of the present disclosure. Referring to FIG. 1, an optical adhesive 100 includes a first adhesive layer 110, a second adhesive layer 120, and a third adhesive layer 130 that are sequentially stacked. For example, storage moduli of the respective adhesive layers are different. For example, a storage modulus of the first adhesive layer 110 is greater than a storage modulus of the third adhesive layer 130, and the storage modulus of the first adhesive layer 110 and the storage modulus of the third adhesive layer 130 are both greater than a storage modulus of the second adhesive layer 120. That is, among the three adhesive layers, the storage modulus of the first adhesive layer 110 is the largest, the storage modulus of the second adhesive layer 120 is the smallest, and the storage modulus of the third adhesive layer 130 is between the storage modulus of the first adhesive layer 110 and the storage modulus of the second adhesive layer 120. For example, the storage modulus of each adhesive layer is positive correlated with hardness, that is, the larger the storage modulus, the greater the hardness. The storage modulus represents the ability of a material to store elastic deformation energy and is an indicator of rebound after the material is deformed.

For example, in at least one example, the storage modulus of the first adhesive layer 110 is 50 KPa-200 KPa, and for example, may further be 50 KPa-100 KPa. For example, the storage modulus of the second adhesive layer 120 is 15 KPa-80 KPa, and for example, may further be 15 KPa-50 KPa. For example, the storage modulus of the third adhesive layer 130 is 30 KPa-100 KPa. The storage modulus of each of the above adhesive layers is measured at a frequency of 1 Hz.

For example, a glass transition temperature of the optical adhesive 100 is lower than −30° C., and for example, the glass transition temperature can be further lower than −40° C., so that the display device using the optical adhesive 100 has better folding performance at low temperature. For example, the operating temperature of the optical adhesive 100 may be −30° C. to 70° C., and for example, may further be −40° C. to 85° C.

For example, in at least one example, a thickness of the first adhesive layer 110 is 2 μm to 30 μm, and for example, may further be 2 μm to 25 μm or 2 μm to 10 μm. A thickness of the second adhesive layer 120 is 5 μm to 100 μm, and for example, may further be 5 μm to 50 μm. A thickness of the third adhesive layer 130 is 2 μm to 100 μm, and for example, may further be 5 μm to 25 μm. For example, the thickness of the first adhesive layer 110 and the thickness of the third adhesive layer 130 may be identical or different, which can be determined according to factors such as interfaces that the first adhesive layer 110 and the third adhesive layer 130 are in contact with, the positions of the first adhesive layer 110 and the third adhesive layer 130 in the stacked structure, and so on.

For example, a transmittance (i.e., light transmittance) of the first adhesive layer 110, a transmittance of the second adhesive layer 120, and a transmittance of the third adhesive layer 130 are all greater than 93%, and a haze of the first adhesive layer 110, a haze of the second adhesive layer 120, and a haze of the third adhesive layer 130 are all less than 1%.

When using the optical adhesive 100, the optical adhesive 100 is bonded between other components provided separately. By selecting a suitable bonding direction, in a case where the component bonded to the optical adhesive 100 is bent or folded, a side of the first adhesive layer 110 away from the second adhesive layer 120 is subjected to a compressive stress (that is, a side of the first adhesive layer 110 in contact with other components is subjected to the compressive stress). Because the storage modulus of the first adhesive layer 110 is the largest among the three adhesive layers, the first adhesive layer 110 can withstand a large compressive stress, thereby effectively suppressing the generation of air bubbles caused by bending or high temperature, and avoiding the occurrence of wrinkles. The storage modulus of the first adhesive layer 110 and the storage modulus of the third adhesive layer 130 both are relatively large, and the first adhesive layer 110 and the third adhesive layer 130 have high adhesiveness and a strong adhesive ability, and can be better adhered to other components. Among the three adhesive layers, the storage modulus of the second adhesive layer 120 is the smallest, which can allow large shear slip and shear strain between the film layers, thereby reducing the bending stress of the components bonded to the optical adhesive 100, effectively suppressing the generation of air bubbles, and avoiding the problems of film failure such as wrinkling, fracturing, and separating.

It should be noted that, in the embodiments of the present disclosure, the optical adhesive 100 is not limited to a three-layer structure composed of the first adhesive layer 110, the second adhesive layer 120, and the third adhesive layer 130, and may also be any multilayer structure, such as 4-layer structure, 5-layer structure, etc. For example, a side of an adhesive layer, that has the largest storage modulus in the multilayer structure and in contact with other components provided separately, is subjected to a compressive stress during bending, and the storage modulus of the adhesive layer, that is in contact with other components, in the multilayer structure is greater than the storage modulus of the adhesive layer, that is not in contact with other components, in the multilayer structure. For example, a fourth adhesive layer may be added between the first adhesive layer 110 and the second adhesive layer 120, and a storage modulus of the fourth adhesive layer is between the storage modulus of the first adhesive layer 110 and the storage modulus of the second adhesive layer 120 and may be larger or smaller than the storage modulus of the third adhesive layer 130. On this basis, a fifth adhesive layer can also be added between the second adhesive layer 120 and the third adhesive layer 130, and a storage modulus of the fifth adhesive layer is between the storage modulus of the second adhesive layer 120 and the storage modulus of the third adhesive layer 130 and can be larger or smaller than the storage modulus of the fourth adhesive layer.

Figure 2:
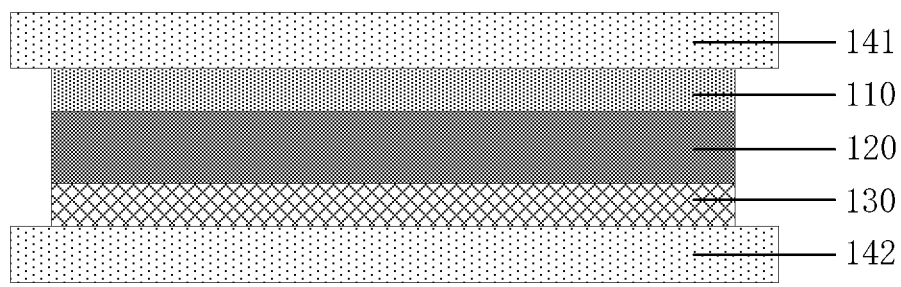
FIG. 2 is a schematic diagram of a layer structure of another optical adhesive provided by at least one embodiment of the present disclosure.

FIG. 2 is a schematic diagram of a layer structure of another optical adhesive provided by at least one embodiment of the present disclosure. Referring to FIG. 2, the optical adhesive 100 in this embodiment is substantially the same as the optical adhesive 100 illustrated in FIG. 1 except that the optical adhesive 100 in this embodiment further includes a first release film 141 and a second release film 142. In this embodiment, the first release film 141 is on a side of the first adhesive layer 110 away from the second adhesive layer 120; and the second release film 142 is on a side of the third adhesive layer 130 away from the second adhesive layer 120.

The first release film 141 covers a surface of the first adhesive layer 110 which is to be bonded to other components, the second release film 142 covers a surface of the third adhesive layer 130 which is to be bonded to other components, and the components to be bonded to the first adhesive layer 110 are different from the components to be bonded to the third adhesive layer 130. The first release film 141 and the second release film 142 can play a protective role, to prevent the first adhesive layer 110, the second adhesive layer 120, and the third adhesive layer 130 from being damaged before being bonded with other components, and to facilitate winding, storage, and transportation. For example, the first release film 141 and the second release film 142 may be polyethylene terephthalate (PET) release films, the first release film 141 may be a heavy release film, and the second release film 142 may be a light release film. For example, the parameters, such as the release force and thickness, of the first release film 141 and the second release film 142 can be determined according to actual needs, so as to have a good peeling effect, and prevent the first adhesive layer 110, the second adhesive layer 120, and the third adhesive layer 130 from being damaged when the first release film 141 and the second release film 142 are peeled off.

For example, the first release film 141 and the second release film 142 are temporary protective layers, and the first adhesive layer 110, the second adhesive layer 120, and the third adhesive layer 130 are function layers. When using the optical adhesive 100, the first release film 141 and the second release film 142 need to be sequentially removed according to the attachment method, and the multilayer structure comprising the first adhesive layer 110, the second adhesive layer 120, and the third adhesive layer 130 is bonded between two components to be attached.

At least one embodiment of the present disclosure further provides a display device, the display device includes a display panel and a cover layer which are stacked, an adhesive film is provided between the display panel and the cover layer, and the adhesive film includes the optical adhesive described in any one of the embodiments of the present disclosure. A side of the first adhesive layer of the optical adhesive away from the second adhesive layer is subjected to a compressive stress in a case where the display device is bent. The optical adhesive in the display device not only has a strong adhesive ability, but also can reduce the bending stress of the components bonded to the optical adhesive, thereby suppressing the generation of air bubbles, and avoiding the problems of film failure such as wrinkling, fracturing, and separating.

Figure 3:
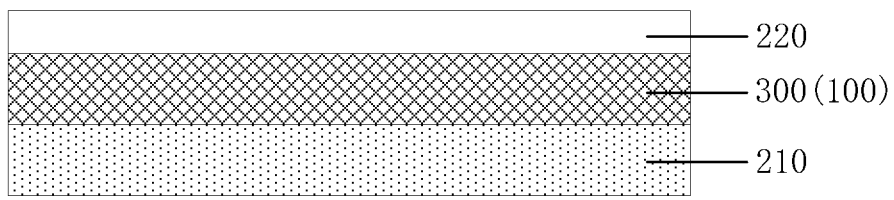
FIG. 3 is a schematic diagram of a layer structure of a display device provided by at least one embodiment of the present disclosure.

FIG. 3 is a schematic diagram of a layer structure of a display device provided by at least one embodiment of the present disclosure. Referring to FIG. 3, a display device 200 includes a display panel 210 and a cover layer 220 that are stacked. An adhesive film 300 is provided between the display panel 210 and the cover layer 220. The adhesive film 300 is the optical adhesive 100 according to any one of the embodiments of the present disclosure.

For example, the optical adhesive 100 is used to bond the display panel 210 and the cover layer 220 together. For example, the display device 200 can be bent or folded. During the process in which the display device 200 is bent or folded, a side of the first adhesive layer 110 of the optical adhesive 100 away from the second adhesive layer 120 is subjected to a compressive stress, that is, a side of the first adhesive layer 110 which is in contact with the display panel 210 or the cover layer 220 is subjected to the compressive stress. The optical adhesive 100 in the display device 200 not only has a strong adhesive ability, but also can reduce the bending stress of the components (such as the display panel 210 or the cover layer 220) bonded to the optical adhesive 100, thereby suppressing the generation of air bubbles, and avoiding the problems of film failure such as wrinkling, fracturing, and separating. For related descriptions of the optical adhesive 100, reference may be made to the foregoing content, and details are not described herein again.

For example, a bonding direction of the optical adhesive 100 is not limited, and the first adhesive layer 110 in the optical adhesive 100 may be in contact with the display panel 210, or may also be in contact with the cover layer 220. Accordingly, the third adhesive layer 130 in the optical adhesive 100 may be in contact with the cover layer 220 or may also be in contact with the display panel 210. For example, the bonding direction of the optical adhesive 100 may be determined according to the bending or folding direction of the display device 200, so that in a case where the display device 200 is bent or folded, the first adhesive layer 110 is subjected to the compressive stress.

For example, the display panel 210 may be a flexible organic light emitting diode (OLED) display panel. For example, the cover layer 220 may be a flexible protective film, such as a polyimide (PI) film. It should be noted that, in the embodiments of the present disclosure, the display device 200 may further include more components and structures. These components and structures should be understood by those of ordinary skill in the art, are not described herein in derail, and should not be taken as a limitation on the embodiments of the present disclosure.

Figure 4:
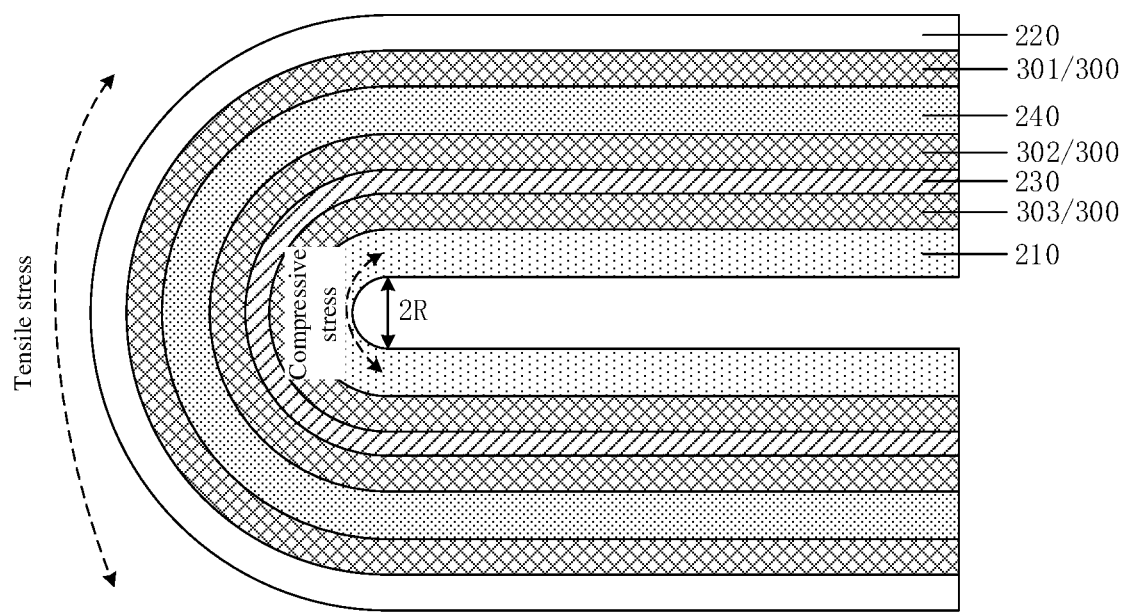
FIG. 4 is a schematic diagram of a layer structure of another display device in a bent state provided by at least one embodiment of the present disclosure.

FIG. 4 is a schematic diagram of a layer structure of another display device in a bent state provided by at least one embodiment of the present disclosure. Referring to FIG. 4, excepting for including the display panel 210 and the cover layer 220, the display device 200 further includes a polarizer 230 and a touch structure layer 240. The polarizer 230 is sandwiched between the display panel 210 and the touch structure layer 240, and the touch structure layer 240 is sandwiched between the polarizer 230 and the cover layer 220. In addition, the adhesive film 300 is provided between the display panel 210 and the polarizer 230, between the polarizer 230 and the touch structure layer 240, and between the touch structure layer 240 and the cover layer 220. The adhesive film 300 is the optical adhesive 100 described in any one of the embodiments of the present disclosure. By providing a plurality of adhesive films 300 (optical adhesives 100), a plurality of components, such as the display panel 210, the polarizer 230, the touch structure layer 240, and the cover layer 220, can be bonded together. For example, the display device 200 may further include other components such as a middle frame, which are not limited in the embodiments of the present disclosure.

Figure 5:
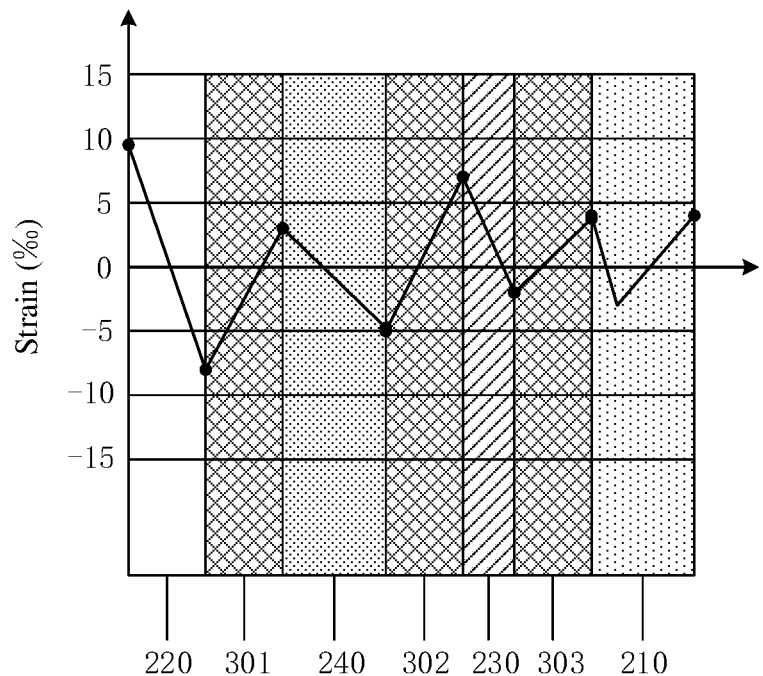
FIG. 5 is a schematic simulation diagram of strains of respective film layers of the display device in the bent state illustrated in FIG. 4.

For example, FIG. 4 illustrates a bent state of the display device 200, and each side of each film layer is subjected to a compressive stress or a tensile stress, and accordingly, shear deformation occurs. FIG. 5 is a schematic simulation diagram of strains of respective film layers of the display device in the bent state illustrated in FIG. 4. Referring to FIGS. 4 and 5, for example, a strain on an outside of the cover layer 220 (the side of the cover layer 220 that is not in contact with a first adhesive film 301) is a positive value, and therefore, the outside of the cover layer 220 is subjected to the tensile stress. A strain on an inner side of the cover layer 220 (the side of the cover layer 220 that is in contact with the first adhesive film 301) is a negative value, and therefore, the inside of the cover layer 220 is subjected to the compressive stress. Similarly, a strain on a side of the first adhesive film 301 that is in contact with the cover layer 220 is a negative value, and thus, the side of the first adhesive film 301 that is in contact with the cover layer 220 is subjected to the compressive stress; and a strain on a side of the first adhesive film 301 that is in contact with the touch structure layer 240 is a positive value, and thus, the side of the first adhesive film 301 that is in contact with the touch structure layer 240 is subjected to the tensile stress. The analysis methods of the stresses, to which other film layers are subjected, are similar to those described herein, and are not repeated.

For example, the first adhesive film 301 is the optical adhesive 100. In a case where the cover layer 220 and the touch structure layer 240 are adhered, the first adhesive layer 110 in the optical adhesive 100 and the cover layer 220 are bonded together, and the third adhesive layer 130 in the optical adhesive 100 and the touch structure layer 240 are bonded together, so that the first adhesive layer 110 is subjected to the compressive stress in a case where the display device 200 is bent. Similarly, a second adhesive film 302 and a third adhesive film 303 are also the optical adhesives 100, the bonding directions are determined according to the strain when bonding the second adhesive film 302 and the third adhesive film 303, so that the first adhesive layer 110 can be subjected to the compressive stress in a case where the display device 200 is bent. For example, the first adhesive layer 110 in the second adhesive film 302 (optical adhesive 100) may be bonded to the touch structure layer 240, and the first adhesive layer 110 in the third adhesive film 303 (optical adhesive 100) is bonded to the polarizer 230, so that the first adhesive layer 110 is subjected to the compressive stress. For example, in a case where the display device 200 illustrated in FIG. 3 needs to be bent along a direction illustrated in FIG. 4 during operation, that is, in a case where the display device 200 is bent, the cover layer 220 is located outside the display panel 210, and in a case where the display panel 210 and the cover layer 220 of the display device 200 illustrated in FIG. 3 are bonded together, the first adhesive layer 110 in the adhesive film 300 (optical adhesive 100) is adhered to the cover layer 220, and the third adhesive layer 130 in the adhesive film 300 is adhered to the display panel 210, so that the first adhesive layer 110 is subjected to the compressive stress.

Because the first adhesive layer 110 has the largest storage modulus in the optical adhesive 100, the first adhesive layer 110 can withstand a large compressive stress, which can effectively suppress the generation of air bubbles caused by bending or high temperature, and can avoid the occurrence of wrinkles. The storage modulus of the first adhesive layer 110 and the storage modulus of the third adhesive layer 130 both are relatively large, so that the first adhesive layer 110 and the third adhesive layer 130 have high adhesiveness and a strong adhesive ability, and can be better bonded to the display panel 210, the cover layer 220, the polarizer 230, the touch structure layer 240, and other components. In the optical adhesive 100, the storage modulus of the second adhesive layer 120 is the smallest, which can allow large shear slip and shear strain between the film layers, thereby partially decoupling the bending stress between the respective film layers, effectively suppressing the generation of air bubbles, and avoiding the problems of film failure such as wrinkling, fracturing, and separating.

For example, as illustrated in FIG. 4, the display device 200 is configured to bend with a radius of curvature R, for example, 1 mm<R<6 mm. In this range, the display device 200 has good bending characteristics, and the problems of film failure such as wrinkling, fracturing, and separating do not occur.

At least one embodiment of the present disclosure also provides a method for manufacturing an optical adhesive. The optical adhesive manufactured by using the method not only has a strong adhesive ability, but also can reduce the bending stress of the components bonded to the optical adhesive, thereby suppressing the generation of air bubbles, and avoiding the problems of film failure such as wrinkling, fracturing, and separating.

Figure 6:
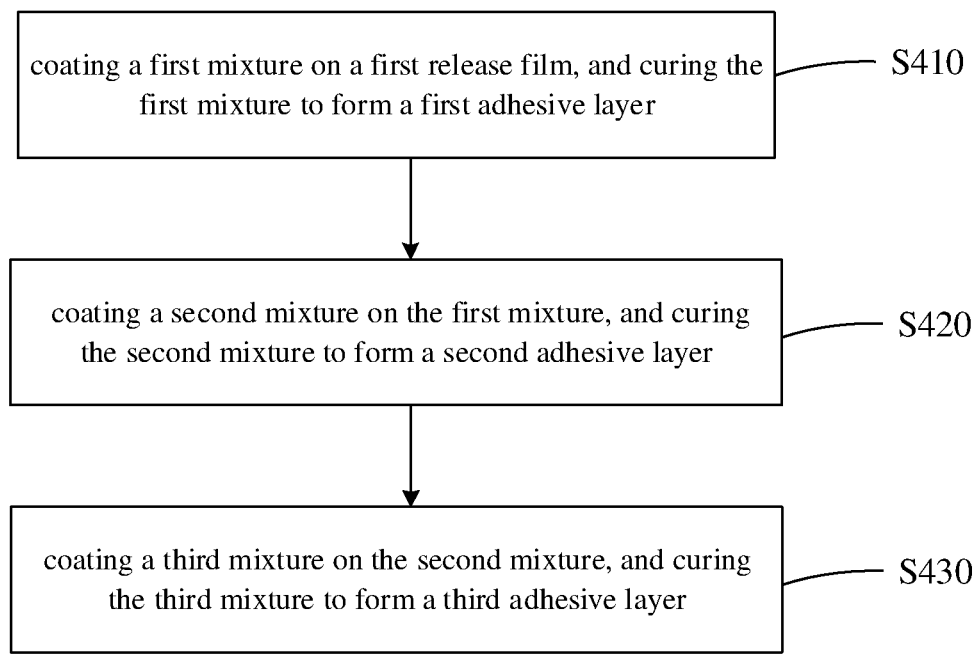
FIG. 6 is a schematic flowchart of a method for manufacturing an optical adhesive provided by at least one embodiment of the present disclosure.

FIG. 6 is a schematic flowchart of a method for manufacturing an optical adhesive provided by at least one embodiment of the present disclosure. The optical adhesive 100 described in any one of the embodiments of the present disclosure can be manufactured by using the method for manufacturing the optical adhesive. For example, referring to FIG. 6, in at least one example, the method for manufacturing the optical adhesive includes following steps.

Step S410: coating a first mixture on a first release film 141, and curing the first mixture to form a first adhesive layer 110.

Step S420: coating a second mixture on the first mixture, and curing the second mixture to form a second adhesive layer 120.

Step S430: coating a third mixture on the second mixture, and curing the third mixture to form a third adhesive layer 130.

For example, a storage modulus of the first adhesive layer 110 is greater than a storage modulus of the third adhesive layer 130, and the storage modulus of the first adhesive layer 110 and the storage modulus of the third adhesive layer 130 are both greater than a storage modulus of the second adhesive layer 120.

For example, in at least one example, the method for manufacturing the optical adhesive further includes: providing a second release film 142 and covering the second release film 142 on a side of the third adhesive layer 130 away from the second adhesive layer 120.

For example, the first adhesive layer 110, the second adhesive layer 120, and the third adhesive layer 130 may be formed in a same curing process, or may also be respectively formed in curing processes which are independent to each other, and the embodiments of the present disclosure are not limited thereto.

Figure 7:
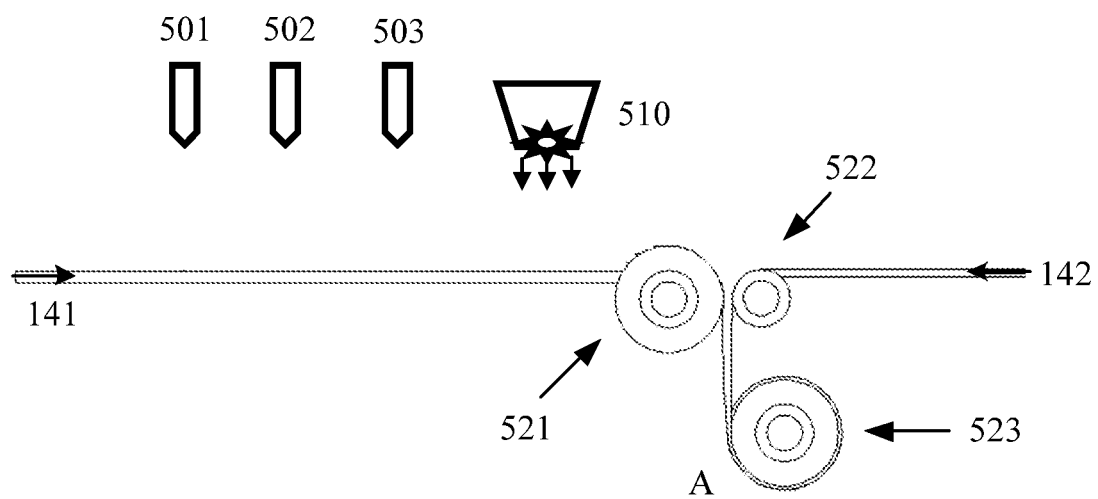
FIG. 7 is a schematic diagram of a process of an optical adhesive provided by at least one embodiment of the present disclosure.

When implementing the method for manufacturing the optical adhesive, a specific process can be determined according to actual needs. For example, referring to FIG. 7, in at least one example, first, the first mixture is coated on the first release film 141 (for example, a heavy release film, a material of the heavy release film is polyethylene terephthalate, and a thickness of heavy release film is 75 μm) by using a first nozzle 501; next, the second mixture is coated on the first mixture by using a second nozzle 502; and then, the third mixture is coated on the second mixture by using a third nozzle 503. After the three-layer mixture is coated, the three-layer mixture is irradiated with an ultraviolet light source 510 (for example, a low-voltage mercury lamp, brand: BL Lamp, Sankyo Co., Ltd.) by using an ultraviolet rays (UV) curing method, and the irradiation time is, for example, 6 minutes, so that the three-layer mixture forms the first adhesive layer 110, the second adhesive layer 120, and the third adhesive layer 130 in the same curing process. A first roller 521 is rotated clockwise to drive the first release film 141 and the adhesive layers thereon to move, a second roller 522 is rotated counterclockwise to drive the second release film 142 (such as a light release film) to move, and a third roller 523 is rotated counterclockwise to cover the second release film 142 on a side of the third adhesive layer 130 away from the second adhesive layer 120 and to make the stacked structure formed by the first release film 141, the second release film 142, and the first to third adhesive layers 110-130 form a reel at a winding terminal A.

For example, the ultraviolet light source 510 may be any suitable light source such as a low-voltage mercury lamp, a medium-voltage mercury lamp, a high-voltage mercury lamp, a chemical lamp, a black light lamp, or the like, and the embodiments of the present disclosure do not limit the ultraviolet light source 510. The irradiation energy of the ultraviolet light source 510 can be set according to actual needs, for example, can be determined according to factors such as the compositions and the response rate to be achieved of the first to third mixtures, and for example, can be 500 mj/cm$^2$ to 3000 mj/cm$^2$. The irradiation time of the ultraviolet light source 510 can also be set according to actual needs, and the embodiments of the present disclosure are not limited thereto.

It should be noted that, in the embodiments of the present disclosure, the curing process is not limited to the UV curing, and any applicable curing method such as thermal curing may be adopted, as long as the purpose of curing can be achieved. In this example, because the first to third mixtures are cured in the same curing process, the process parameters (such as the irradiation energy, the irradiation time, etc.) are all the same, by making a ratio of the initiator in the first mixture, a ratio of the initiator in the second mixture, and a ratio of the initiator in the third mixture different, a reaction rate of the first mixture, a reaction rate of the second mixture, and a reaction rate of the third mixture are different in the same curing process, so that the storage modulus of the formed first adhesive layer 110, the storage modulus of the formed second adhesive layer 120, and the storage modulus of the formed third adhesive layer 130 can meet the requirements, that is, the storage modulus of the first adhesive layer 110 is greater than the storage modulus of the third adhesive layer 130, and the storage modulus of the first adhesive layer 110 and the storage modulus of the third adhesive layer 130 are both greater than the storage modulus of the second adhesive layer 120.

The process of the optical adhesive 100 is not limited to the method described above, and may also be other methods. For example, referring to FIG. 7, in another example, first, the first mixture is coated on the first release film 141 by using the first nozzle 501, and then the first mixture is irradiated with the ultraviolet light source 510, so as to cure the first mixture to form the first adhesive layer 110. Next, the second mixture is coated on the first mixture (the first mixture has been cured into the first adhesive layer 110) by using the second nozzle 502, and then the second mixture is irradiated with the ultraviolet light source 510, so as to cure the second mixture to form the second adhesive layer 120. Next, the third mixture is coated on the second mixture (the second mixture has been cured into the second adhesive layer 120) by using the third nozzle 503, and then the third mixture is irradiated with the ultraviolet light source 510, so as to cure the third mixture to form the third adhesive layer 130. The first roller 521 is rotated clockwise to drive the first release film 141 and the adhesive layers thereon to move, the second roller 522 is rotated counterclockwise to drive the second release film 142 to move, and the third roller 523 is rotated counterclockwise to cover the second release film 142 on a side of the third adhesive layer 130 away from the second adhesive layer 120 and to make a stacked structure formed by the first release film 141, the second release film 142, and the first to third adhesive layers 110-130 form a reel at the winding terminal A.

In this example, because the first to third mixtures are respectively cured in different curing processes, the first to third mixtures can be mixtures of the same compositions and proportions, and by adjusting the process parameters (such as the irradiation energy, the irradiation time, etc.) of each curing process, the reaction rates of the first to third mixtures, which are coated, are different, so that the storage moduli of the formed adhesive layers can meet the requirements, that is, the storage modulus of the first adhesive layer 110 is greater than the storage modulus of the third adhesive layer 130, and the storage modulus of the first adhesive layer 110 and the storage modulus of the third adhesive layer 130 are both greater than the storage modulus of the second adhesive layer 120. Of course, the embodiments of the present disclosure are not limited to this case, and in this example, in order to make the storage modulus of each adhesive layer meet the requirements, only the compositions and the proportions of the first to third mixtures may be adjusted, or only the process parameters of each curing process can be adjusted, or the compositions and the proportions of the first to third mixtures and the process parameters of each curing process can be adjusted simultaneously, which can be flexibly set according to actual needs.

For example, each of the first mixture, the second mixture, and the third mixture comprises a monomer mixture, an initiator, and a crosslinking agent. For example, the first mixture, the second mixture, and the third mixture include the same monomer mixture, the same initiator, and the same crosslinking agent, but the content of each component is adjusted as needed; and for another example, at least one of the monomer mixture, the initiator, and the crosslinking agent in the first mixture, the second mixture, and the third mixture is different.

For example, the monomer mixture may include a monomer for forming a (methyl) acrylic copolymer containing hydroxyl group, such as 2-ethylhexyl acrylate (EHA), 4-hydroxybutyl acrylate (HBA), 2-hydroxyethyl acrylate (HEA), or the like. The acrylic copolymer containing the hydroxyl group can form a matrix of an optical adhesive and can provide adhesion. Of course, the embodiments of the present disclosure are not limited thereto, and the monomer (or resin) may be one or more selected from a group consisting of an acrylic resin, a polyurethane resin, an epoxy polyester resin, a silicon resin, a polyisoprene, a polycarbonate resin, a polyimide resin, and a cycloolefin polymer resin, and may further be, for example, a (methyl) acrylic resin. Because the adhesive material has different adhesive performance to different interfaces, the first mixture used to form the first adhesive layer 110 and the third mixture used to form the third adhesive layer 130 may change the resin type and the proportion according to different contact interfaces.

For example, the monomer mixture may include an acrylate containing hydroxyl group and a comonomer. Here, the "comonomer" is different from the acrylate containing hydroxyl group. The acrylate containing hydroxyl group may include at least one selected from a group consisting of a (methyl) acrylate containing $C_1$ to $C_{20}$ alkyl groups having at least one hydroxyl group, a (methyl) acrylate containing $C_5$ to $C_{20}$ cycloalkyl groups having at least one hydroxyl group, a (methyl) acrylate containing $C_6$ to $C_{20}$ aryl groups having at least one hydroxyl group, and the embodiments of the present disclosure are not limited thereto.

For example, the (methyl) acrylate containing hydroxyl group may include at least one selected from a group consisting of 2-hydroxyethyl (methyl) acrylate, 4-hydroxybutyl (methyl) acrylate, 2-hydroxypropyl (methyl) acrylate, 2-hydroxybutyl (methyl) acrylate, and 6-hydroxyhexyl (methyl) acrylate, and the embodiments of the present disclosure are not limited thereto.

For example, the (methyl) acrylic monomer containing $C_1$ to $C_5$ alkyl groups having a hydroxyl group can further improve the adhesiveness of the optical adhesive. In the monomer mixture, the (methyl) acrylic monomer containing hydroxyl group may be from about 5 wt % to about 40 wt % by weight, and within this range, the optical adhesive has a low haze and can have a good adhesive strength.

For example, the comonomer may include at least one selected from a group consisting of a (methyl) acrylic acid alkyl ester monomer, an ethylene-oxide-containing monomer, a propylene-oxide-containing monomer, an amine-group-containing monomer, an amide-group-containing monomer, an alkoxy-group-containing monomer, a phosphate-group-containing monomer, a sulfonic-acid-group-containing monomer, a phenyl-group-containing monomer, and a silane-group-containing monomer, and the embodiments of the present disclosure are not limited thereto.

For example, the initiator can make the monomer mixture cure (or partially polymerize) to form a (methyl) acrylic acid copolymer, or can be used to cure a viscous liquid into a film. The initiator may be a photopolymerization initiator or a thermal polymerization initiator, and may also be other types of initiators, which may depend on the adopted curing method. For example, the photopolymerization initiator may be commercially available Irgacure 651 (ingredient: 2, 2-dimethoxy-2-phenylacetophenone, brand: BASF) or commercially available Irgacure 184 (ingredient: 1-hydroxycyclohexyl benzophenone, brand: BASF).

For example, the crosslinking agent can ameliorate the heat resistance and strength of the optical adhesive, and can generate chemical bonds between linear molecules to interconnect the linear molecules to form a network structure, thereby improving the performance of the optical adhesive. For example, the crosslinking agent can use 1, 6-hexanediol diacrylate. Of course, the embodiments of the present disclosure are not limited thereto, and the crosslinking agent may also adopt other applicable materials.

For example, in at least one example, each of the first mixture, the second mixture, and the third mixture further includes organic nanoparticles. In general, as the temperature increases, the storage modulus of the optical adhesive decreases. In the embodiments of the present disclosure, by adding the organic nanoparticles to the mixture, the storage modulus of the optical adhesive can be maintained as stable as possible, and in a case where the temperature increases, the storage modulus is not reduced or the change amount of the storage modulus is small, thereby improving the use performance of the optical adhesive at high temperatures. For example, a material of the organic nanoparticles can be at least one selected from a group consisting of polymethyl methacrylate, polyethyl methacrylate, polypropyl methacrylate, polybutyl methacrylate, polyisopropyl methacrylate, polyisobutyl methacrylate, and polycyclohexyl methacrylate. For example, in a case where the polymethyl methacrylate is used as the material of the organic nanoparticles, the organic nanoparticles have a better ability to maintain the storage modulus of the optical adhesive. Of course, the embodiments of the present disclosure are not limited thereto, and the organic nanoparticles can adopt any applicable organic materials.

In the embodiments of the present disclosure, a method for manufacturing the first mixture, the second mixture, and the third mixture may adopt a conventional method for manufacturing a mixture, and for example, may adopt a method of mechanical mixing, ultrasonic mixing, or the like. For example, in at least one example, the mixture can be prepared by thoroughly mixing 100 parts by weight of the monomer mixture containing 65% by weight of 2-ethylhexyl acrylate and 35% by weight of 4-hydroxybutyl acrylate, 4 parts by weight of the organic nanoparticles, and 0.005 parts by weight of the photopolymerization initiator in a glass container. After replacing the dissolved oxygen in the glass container with nitrogen, the mixture is irradiated with UV light from a low-voltage mercury lamp, and the mixture is partially polymerized to obtain a mixture including (methyl) acrylic copolymers (i.e., a prepolymer) containing hydroxyl groups, monomers, and organic nanoparticles, and the mixture has a viscosity of about 2000 cPs. A photopolymerization initiator is added to the above-mentioned mixture in an amount of 5 parts by weight relative to 100 parts by weight of the monomer mixture, thereby obtaining the desired mixture (i.e., the first mixture, the second mixture, or the third mixture).

For example, the above mixture can be cured to form the first adhesive layer 110, the second adhesive layer 120, or the third adhesive layer 130, and only the process parameters of the curing process need to be adjusted to control the reaction rate of the mixture, so that the required storage modulus can be achieved. It should be noted that, in the embodiments of the present disclosure, the method for manufacturing the mixture is not limited to the above-mentioned method, and the proportions of various compositions are not limited to the above-mentioned proportions. The method for manufacturing the mixture and the proportions of various compositions should be understood by those of ordinary skill in the art, which are not repeated here and should not be regarded as a limitation on the embodiments of the present disclosure.

It should be noted that, in the embodiments of the present disclosure, the monomer (or the resin), the initiator, the crosslinking agent, and the organic nanoparticles are all commercially available products, and can use conventional materials. The manufacturing process used can be conventional coating process, curing process and other processes. For the method of adjusting the storage modulus of the first adhesive layer 110, the storage modulus of the second adhesive layer 120, and the storage modulus of the third adhesive layer 130 (for example, making the ratio of the initiator in the first mixture, the ratio of the initiator in the second mixture, and the ratio of the initiator in the third mixture different, or changing the parameters of the curing process to make the reaction rate of the first mixture, the reaction rate of the second mixture, and the reaction rate of the third mixture different), those skilled in the art should understand, and details are not repeated here, which should not be regarded as a limitation on the embodiments of the present disclosure. The first mixture, the second mixture, and the third mixture may include more or less compositions, and the ratio of each composition may be determined according to actual needs, moreover, the compositions of the first mixture, the compositions of the second mixture, and the compositions of the third mixture may be identical or different, and the embodiments of the present disclosure are not limited thereto.

The following statements should be noted.

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only specific implementations of the present disclosure, and are not intended to limit the protection scope of the present disclosure, and the protection scope of the present disclosure should be based on the protection scope of the appended claims.

What is claimed is:

1. An optical adhesive, comprising a first adhesive layer, a second adhesive layer, and a third adhesive layer that are sequentially stacked,
wherein a storage modulus of the first adhesive layer is greater than a storage modulus of the third adhesive layer, and the storage modulus of the first adhesive layer and the storage modulus of the third adhesive layer are both greater than a storage modulus of the second adhesive layer.

2. The optical adhesive according to claim 1, wherein the storage modulus of the first adhesive layer is 50 KPa-200 KPa.

3. The optical adhesive according to claim 1, wherein the storage modulus of the second adhesive layer is 15 KPa-80 KPa.

4. The optical adhesive according to claim 1, wherein the storage modulus of the third adhesive layer is 30 KPa-100 KPa.

5. The optical adhesive according to claim 1, wherein a glass transition temperature of the optical adhesive is lower than −30° C.

6. The optical adhesive according to claim 1, wherein a thickness of the first adhesive layer is 2 μm to 30 μm, a thickness of the second adhesive layer is 5 μm to 100 μm, and a thickness of the third adhesive layer is 2 μm to 100 μm.

7. The optical adhesive according to claim 1, further comprising:
a first release film on a side of the first adhesive layer away from the second adhesive layer; and
a second release film on a side of the third adhesive layer away from the second adhesive layer.

8. The optical adhesive according to claim 1, wherein a transmittance of the first adhesive layer, a transmittance of the second adhesive layer, and a transmittance of the third adhesive layer are all greater than 93%, and a haze of the first adhesive layer, a haze of the second adhesive layer, and a haze of the third adhesive layer are all less than 1%.

9. A display device, comprising a display panel and a cover layer which are stacked,
wherein an adhesive film is provided between the display panel and the cover layer, the adhesive film comprises the optical adhesive according to claim 1, and
a side of the first adhesive layer of the optical adhesive away from the second adhesive layer is subjected to a compressive stress in a case where the display device is bent.

10. The display device according to claim 9, wherein, in the case where the display device is bent, the cover layer is outside the display panel,
the first adhesive layer is in contact with the cover layer, and the third adhesive layer is in contact with the display panel.

11. The display device according to claim 9, wherein the display panel is a flexible organic light emitting diode display panel.

12. The display device according to claim 9, further comprising a polarizer,
wherein the polarizer is between the display panel and the cover layer, and the adhesive film is provided between the display panel and the polarizer as well as between the polarizer and the cover layer.

13. The display device according to claim 12, further comprising a touch structure layer,
wherein the touch structure layer is sandwiched between the polarizer and the cover layer, and the adhesive film is provided between the polarizer and touch structure layer as well as between the touch structure layer and the cover layer.

14. A method for manufacturing an optical adhesive, comprising:
coating a first mixture on a first release film, and curing the first mixture to form a first adhesive layer;
coating a second mixture on the first mixture, and curing the second mixture to form a second adhesive layer; and
coating a third mixture on the second mixture, and curing the third mixture to form a third adhesive layer,
wherein a storage modulus of the first adhesive layer is greater than a storage modulus of the third adhesive layer, and the storage modulus of the first adhesive layer and the storage modulus of the third adhesive layer are both greater than a storage modulus of the second adhesive layer.

15. The method for manufacturing the optical adhesive according to claim 14, wherein the first adhesive layer, the second adhesive layer, and the third adhesive layer are formed in a same curing process, or are respectively formed in curing processes which are independent to each other.

16. The method for manufacturing the optical adhesive according to claim 14, further comprising:
providing a second release film, and covering the second release film on a side of the third adhesive layer away from the second adhesive layer.

17. The method for manufacturing the optical adhesive according to claim 14, wherein at least one of the first mixture, the second mixture, and the third mixture comprises a monomer mixture, an initiator, and a crosslinking agent.

18. The method for manufacturing the optical adhesive according to claim 17, wherein at least one of the first mixture, the second mixture, and the third mixture further comprises organic nanoparticles.

19. The method for manufacturing the optical adhesive according to claim 17, wherein a ratio of the initiator in the first mixture, a ratio of the initiator in the second mixture, and a ratio of the initiator in the third mixture are different, so as to allow the storage modulus of the first adhesive layer to be greater than the storage modulus of the third adhesive layer and allow both the storage modulus of the first adhesive layer and the storage modulus of the third adhesive layer to be greater than the storage modulus of the second adhesive layer.

20. The method for manufacturing the optical adhesive according to claim 14, wherein in curing processes of forming the first adhesive layer, the second adhesive layer, and the third adhesive layer, respectively, a reaction rate of the first mixture, a reaction rate of the second mixture, and a reaction rate of the third mixture are different, so as to allow the storage modulus of the first adhesive layer to be greater than the storage modulus of the third adhesive layer and allow both the storage modulus of the first adhesive layer and the storage modulus of the third adhesive layer to be greater than the storage modulus of the second adhesive layer.

* * * * *